US012198856B2

(12) United States Patent
Kim et al.

(10) Patent No.: US 12,198,856 B2
(45) Date of Patent: Jan. 14, 2025

(54) ELECTRONIC COMPONENT, BONDING PORTION REGIONS THEREON, MOUNTED ON A BOARD

(71) Applicant: SAMSUNG ELECTRO-MECHANICS CO., LTD., Suwon-si (KR)

(72) Inventors: Sang Yeop Kim, Suwon-si (KR); Kyong Nam Hwang, Suwon-si (KR); Eun Ji Kim, Suwon-si (KR); Do Hyun An, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 273 days.

(21) Appl. No.: 17/846,615

(22) Filed: Jun. 22, 2022

(65) Prior Publication Data

US 2023/0045941 A1    Feb. 16, 2023

(30) Foreign Application Priority Data

Aug. 9, 2021  (KR) .................. 10-2021-0104513
Jan. 12, 2022 (KR) .................. 10-2022-0004550

(51) Int. Cl.
  *H01G 2/06*   (2006.01)
  *H01G 4/248*  (2006.01)
  *H01G 4/30*   (2006.01)

(52) U.S. Cl.
  CPC ............. *H01G 2/065* (2013.01); *H01G 4/248* (2013.01); *H01G 4/30* (2013.01)

(58) Field of Classification Search
  None
  See application file for complete search history.

(56) References Cited

U.S. PATENT DOCUMENTS 9,245,690 B2 *  1/2016  Park .................... H01G 4/2325
9,313,892 B2 *  4/2016  Hattori ................. H01G 4/232
(Continued)

FOREIGN PATENT DOCUMENTS

KR   10-2019-0045748 A   5/2019
KR   10-2019-0098016 A   8/2019

OTHER PUBLICATIONS

English_transation_CN110265216 (Year: 2019).*
CN104979096_English_translation (Year: 2015).*

*Primary Examiner* — Timothy J. Dole
*Assistant Examiner* — Muhammed Azam
(74) *Attorney, Agent, or Firm* — Morgan, Lewis & Bockius LLP

(57) ABSTRACT

The electronic component includes: a capacitor body; first and second external electrodes on a mounting surface of the capacitor body; first and second connection terminals respectively connected to the first and second external electrodes; a first bonding portion between the first external electrode and the first connection terminal, and including a first-2-th region and a first-1-th region, the first-2-th region being adjacent to a center of the capacitor body and including a conductive resin, and the first-1-th region being adjacent to one end of the capacitor body and including a high melting point solder; and a second bonding portion between the second external electrode and the second connection terminal, and including a second-2-th region and a second-1-th region, the second-2-th region being adjacent to the center of the capacitor body and the second-1-th region being adjacent to the other end of the capacitor body.

24 Claims, 14 Drawing Sheets

(56) References Cited

U.S. PATENT DOCUMENTS

| | | | | |
|---|---|---|---|---|
| 9,439,301 B2* | 9/2016 | Jeon | H05K 3/3442 |
| 9,460,854 B2* | 10/2016 | Park | H01G 2/065 |
| 9,526,174 B2* | 12/2016 | Park | H05K 1/181 |
| 9,545,005 B2* | 1/2017 | Park | H01G 4/228 |
| 9,646,769 B2* | 5/2017 | Park | H05K 3/3426 |
| 9,706,641 B1* | 7/2017 | Park | H01G 4/232 |
| 9,799,453 B2* | 10/2017 | Ahn | H01G 4/1227 |
| 9,818,541 B2* | 11/2017 | Park | H01G 2/06 |
| 9,928,957 B2* | 3/2018 | Park | H01G 2/065 |
| 9,974,183 B2* | 5/2018 | Chae | H01G 4/30 |
| 9,997,294 B2* | 6/2018 | Chung | H01G 4/005 |
| 10,043,613 B2* | 8/2018 | Kim | H01G 4/232 |
| 10,056,193 B1* | 8/2018 | Son | H01G 4/232 |
| 10,062,511 B1* | 8/2018 | Park | H05K 1/111 |
| 10,074,481 B2* | 9/2018 | Park | H01G 2/06 |
| 10,121,593 B2* | 11/2018 | Hattori | H01G 2/065 |
| 10,128,050 B1* | 11/2018 | Park | H05K 1/111 |
| 10,192,685 B2* | 1/2019 | Park | H01G 4/232 |
| 10,192,686 B1* | 1/2019 | Park | H01G 2/06 |
| 10,204,739 B1* | 2/2019 | Ji | H01G 4/232 |
| 10,229,790 B2* | 3/2019 | Park | H01G 4/30 |
| 10,325,723 B1* | 6/2019 | Kim | H01G 4/012 |
| 10,347,425 B2* | 7/2019 | Park | H01G 4/232 |
| 10,366,839 B1* | 7/2019 | Kim | H01G 4/248 |
| 10,403,441 B2* | 9/2019 | Kim | H02H 9/02 |
| 10,531,565 B2* | 1/2020 | Fujita | H05K 1/186 |
| 10,542,626 B2* | 1/2020 | Kim | H01G 4/232 |
| 10,910,155 B2* | 2/2021 | Sim | H05K 1/181 |
| 11,289,275 B2* | 3/2022 | Son | H01G 4/30 |
| 2007/0249161 A1* | 10/2007 | Nakaone | H01R 12/52 257/734 |
| 2013/0033836 A1* | 2/2013 | Hattori | H01G 4/232 361/768 |
| 2013/0037911 A1* | 2/2013 | Hattori | H01L 28/40 257/532 |
| 2013/0284507 A1* | 10/2013 | Hattori | H05K 1/181 174/260 |
| 2013/0329389 A1* | 12/2013 | Hattori | H01G 4/232 361/782 |
| 2014/0016242 A1* | 1/2014 | Hattori | H05K 1/181 361/303 |
| 2014/0085850 A1* | 3/2014 | Li | H05K 1/0231 29/841 |
| 2014/0124256 A1* | 5/2014 | Hattori | H05K 1/181 174/260 |
| 2014/0160618 A1* | 6/2014 | Yoon | H01G 4/12 29/25.03 |
| 2014/0168851 A1* | 6/2014 | Lee | H01G 4/012 361/303 |
| 2014/0177128 A1* | 6/2014 | Kim | H01G 4/012 361/301.4 |
| 2014/0345926 A1* | 11/2014 | Lee | H01G 4/30 361/301.4 |
| 2015/0041195 A1* | 2/2015 | Ahn | H01G 4/30 361/301.4 |
| 2015/0223334 A1* | 8/2015 | Nakagawa | H01G 4/12 174/258 |
| 2015/0340154 A1* | 11/2015 | Kim | H01G 2/22 361/275.1 |
| 2016/0007446 A1* | 1/2016 | Ishikawa | H01G 4/12 361/301.4 |
| 2016/0020024 A1* | 1/2016 | Shin | H01G 9/012 174/260 |
| 2016/0088733 A1* | 3/2016 | Lee | H05K 3/3442 361/768 |
| 2016/0088735 A1* | 3/2016 | Park | H05K 1/181 361/782 |
| 2016/0133386 A1* | 5/2016 | Park | H01G 4/228 361/767 |
| 2016/0203914 A1* | 7/2016 | Park | H05K 1/181 361/301.4 |
| 2016/0205769 A1* | 7/2016 | Park | H01L 23/642 174/260 |
| 2019/0252121 A1* | 8/2019 | Park | H01G 2/065 |
| 2020/0082979 A1* | 3/2020 | Kim | H05K 3/301 |
| 2020/0343048 A1 | 10/2020 | Yokomizo | |
| 2022/0181078 A1* | 6/2022 | Kim | H01G 4/30 |
| 2023/0045941 A1* | 2/2023 | Kim | H01G 4/232 |

\* cited by examiner

ELECTRONIC COMPONENT, BONDING PORTION REGIONS THEREON, MOUNTED ON A BOARD

CROSS-REFERENCE TO RELATED APPLICATION(S)

This application claims benefit of priority to Korean Patent Application Nos. 10-2021-0104513 filed on Aug. 9, 2021 and 10-2022-0004550 filed on Jan. 12, 2022 in the Korean Intellectual Property Office, the disclosure of which is incorporated herein by reference in its entirety.

TECHNICAL FIELD

The present disclosure relates to an electronic component and a board having the same mounted thereon.

BACKGROUND

A multilayer capacitor may have a small size and high capacitance, and thus may be used in any of various electronic devices.

In recent years, eco-friendly vehicles and electric vehicles have rapidly become popular, and more power drive systems are thus being used in such vehicles. Accordingly, there is also increasing demand for multilayer capacitors required for such vehicles.

A component for a vehicle may require a high level of thermal or electrical reliability, and therefore, there has been also gradually increasing demand for the multilayer capacitor having high performance.

Particularly required is a structure of a capacitor which may realize high capacitance in a limited space or a capacitor which has strong resistance to vibrations and deformation.

SUMMARY

An aspect of the present disclosure may provide an electronic component and a board having the same mounted thereon.

According to an aspect of the present disclosure, an electronic component may include: a capacitor body; first and second external electrodes disposed on a mounting surface of the capacitor body, while being spaced apart from each other; first and second connection terminals respectively connected to the first and second external electrodes; a first bonding portion disposed between the first external electrode and the first connection terminal, and including a first-2-th region and a first-1-th region, the first-2-th region being adjacent to a center of the capacitor body and including a conductive resin, and the first-1-th region being adjacent to one end of the capacitor body and including a high melting point solder; and a second bonding portion disposed between the second external electrode and the second connection terminal, and including a second-2-th region and a second-1-th region, the second-2-th region being adjacent to the center of the capacitor body and including the conductive resin and the second-1-th region being adjacent to the other end of the capacitor body and including the high melting point solder.

The capacitor body may include a plurality of dielectric layers and a plurality of first and second internal electrodes alternately disposed having the dielectric layer interposed therebetween, and may include first and second surfaces opposing each other, and third and fourth surfaces connected to the first and second surfaces and opposing each other, one end of the first or second internal electrode extending from the third or fourth surface.

The first and second external electrodes may respectively include first and second connection portions respectively disposed on the third and fourth surfaces of the capacitor body; and first and second band portions respectively extended from the first and second connection portions to a portion of the first surface of the capacitor body, and respectively connected to the first and second connection portions.

The first-1-th region may be positioned below the first band portion, the first-2-th region may be positioned below the first band portion and the first surface of the capacitor body, the second-1-th region may be positioned below the second band portion, and the second-2-th region may be positioned below the second band portion and the first surface of the capacitor body.

0.25 to 0.9 may be a value range of T2/(T2+T1) when T1 indicates a length of the first-1-th region or second-1-th region and T2 indicates a length of the first-2-th region or second-2-th region, in a direction in which the first and second external electrodes oppose each other.

The electronic component may further include a plating layer disposed on each surface of the first and second external electrodes.

According to another aspect of the present disclosure, a board having an electronic component mounted thereon may include: a board having first and second electrode pads disposed on one surface thereof, and an electronic component mounted on the board for the first and second connection terminals, respectively connected to the first and second electrode pads.

According to an aspect of the present disclosure, an electronic component may include: a capacitor body; first and second external electrodes disposed on a mounting surface of the capacitor body; first and second connection terminals connected to the first and second external electrodes, respectively; a first bonding portion disposed between the first external electrode and the first connection terminal; and a second bonding portion disposed between the second external electrode and the second connection terminal, wherein at least one of the first and second bonding portions include a first region including a high melting point solder and a second region including a conductive resin.

The second region may contact a surface of the body.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
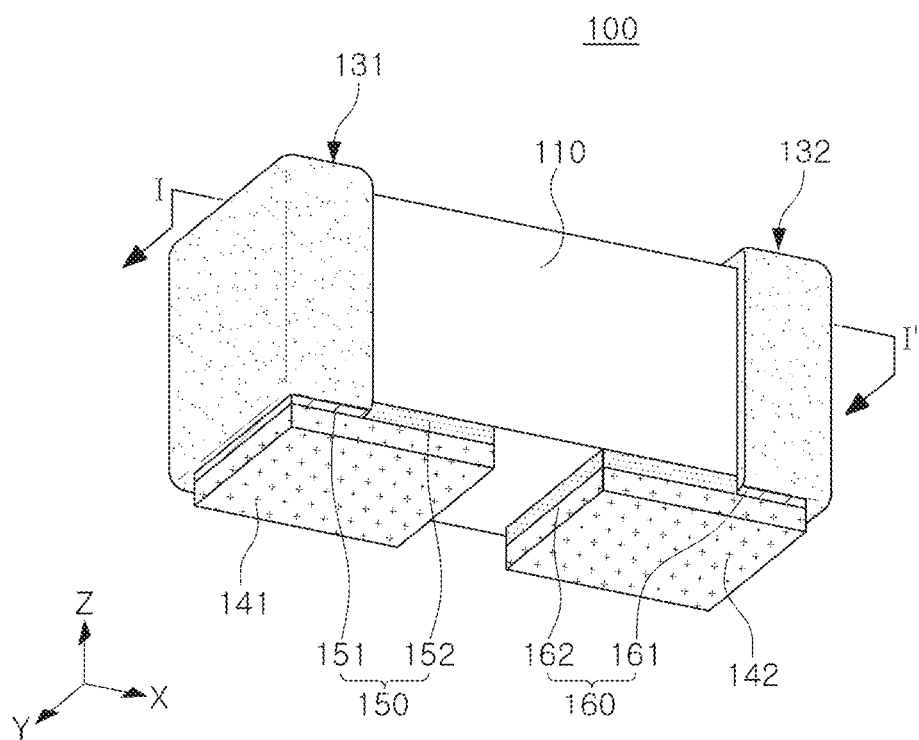
FIG. 1 is a perspective view schematically illustrating an electronic component according to an exemplary embodiment of the present disclosure.
Figure 2:
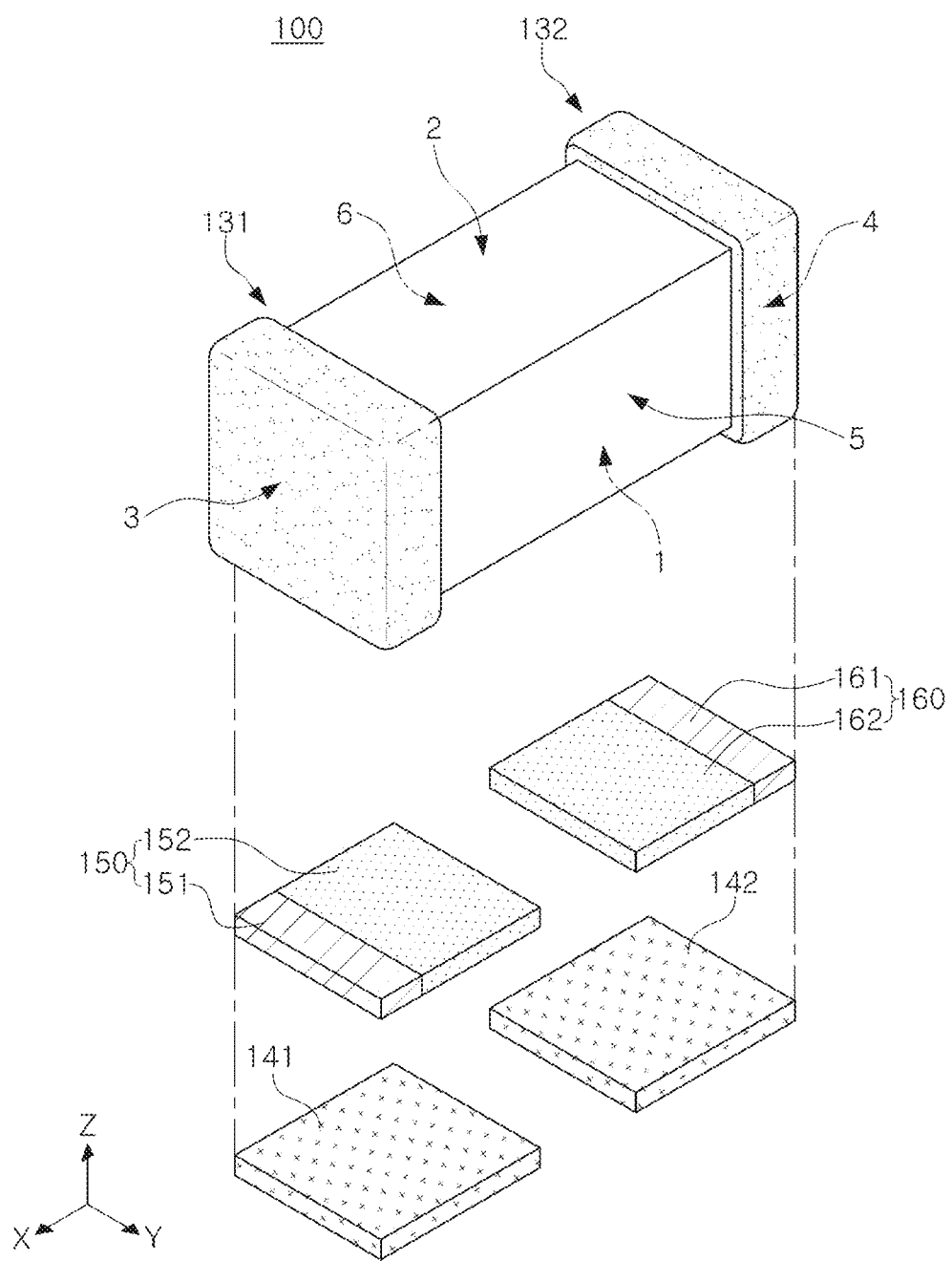
FIG. 2 is an exploded perspective view of FIG. 1.
Figure 3A:
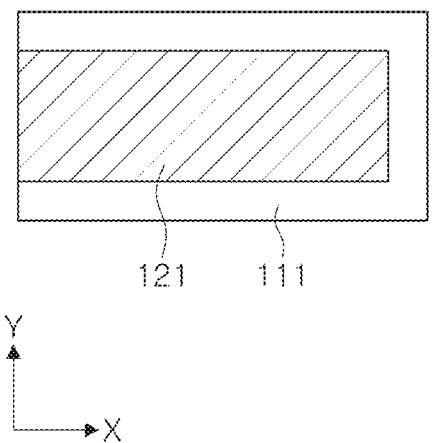
FIGS. 3A and 3B are plan views respectively illustrating first and second internal electrodes of the electronic component according to an exemplary embodiment of the present disclosure.
Figure 3B:
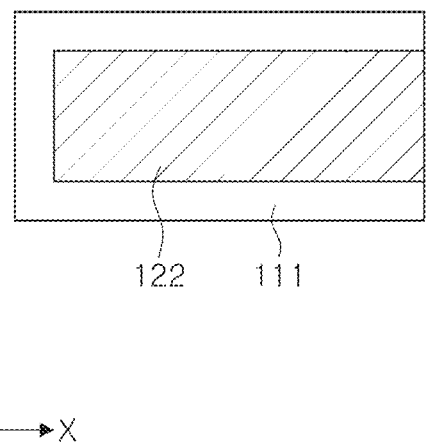
Figure 4:
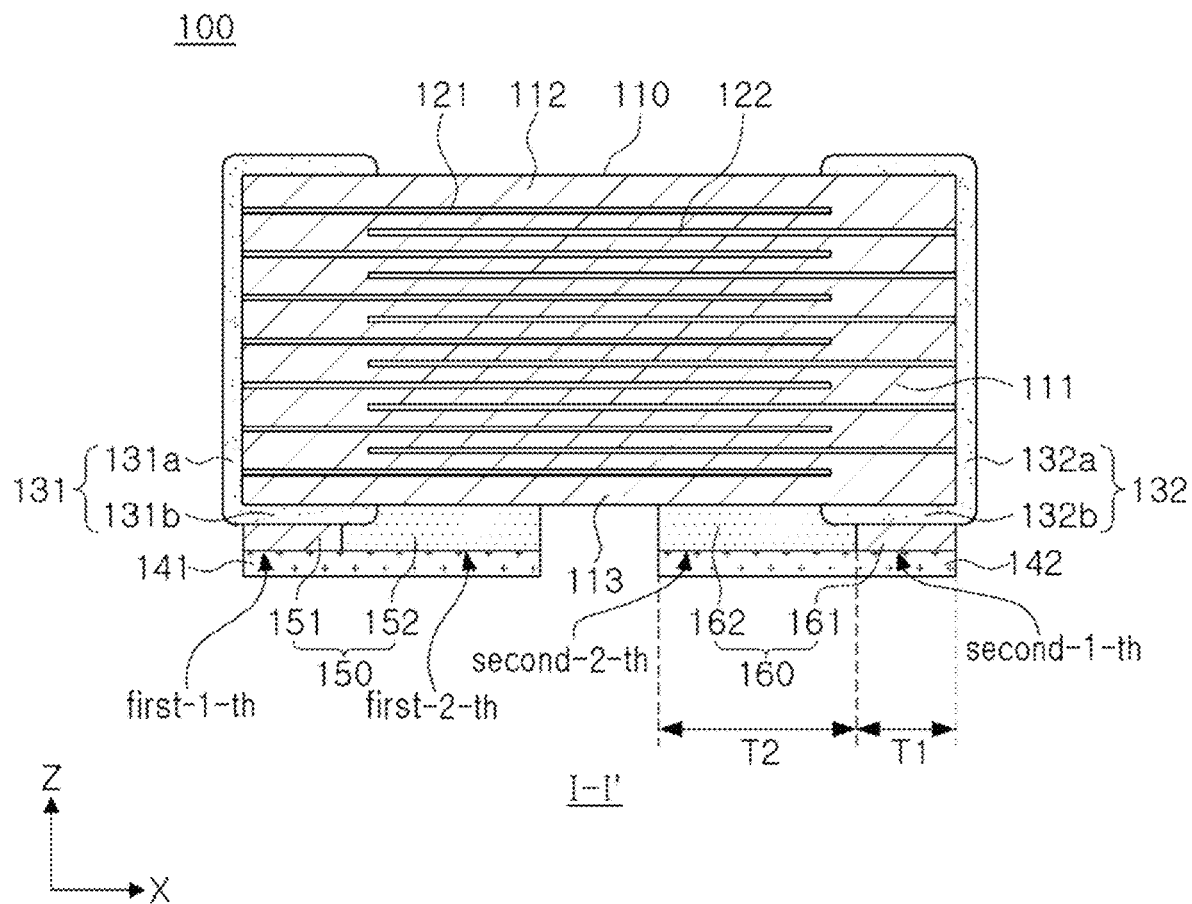
FIG. 4 is a cross-sectional view taken along line I-I' of FIG. 1.

FIG. 1 is a perspective view schematically illustrating an electronic component according to an exemplary embodiment of the present disclosure; FIG. 2 is an exploded perspective view of FIG. 1; FIGS. 3A and 3B are plan views respectively illustrating first and second internal electrodes of the electronic component according to an exemplary embodiment of the present disclosure; and FIG. 4 is a cross-sectional view taken along line I-I' of FIG. 1.

Referring to FIGS. 1 through 4, an electronic component 100 according to an exemplary embodiment of the present disclosure may include a capacitor body 110, first and second external electrodes 131 and 132, first and second connection terminals 141 and 142, and first and second bonding portions 150 and 160.

Hereinafter, in order to clearly describe exemplary embodiments of the present disclosure, directions of the capacitor body 110 are defined as follows: X, Y and Z directions in the drawings respectively refer to the length direction, width direction and thickness direction of the capacitor body 110. In addition, in this exemplary embodiment, the thickness direction may refer to a stack direction in which dielectric layers are stacked on each other.

The capacitor body 110 may be formed by stacking and then sintering a plurality of dielectric layers 111 in the Z direction, and include the plurality of dielectric layers 111 and a plurality of first and second internal electrodes 121 and 122 alternately disposed in the Z direction, while having the dielectric layer 111 interposed therebetween.

In addition, covers 112 and 113 each having a predetermined thickness may be formed on both sides of the capacitor body 110 in the Z direction, if necessary.

Here, respective adjacent dielectric layers 111 of the capacitor body 110 may be integrated with each other so that boundaries therebetween may not be readily apparent.

The capacitor body 110 may have a substantially hexahedral shape, and the present disclosure is not limited thereto.

In this exemplary embodiment, for convenience of explanation, first and second surfaces 1 and 2 may refer to opposite surfaces of the capacitor body 110, opposing each other, in the Z direction, third and fourth surfaces 3 and 4 may refer to opposite surfaces of the capacitor body 110, connected to the first and second surfaces 1 and 2 and opposing each other in the X direction, and fifth and sixth surfaces 5 and 6 may refer to opposite surfaces of the capacitor body 110, connected to the first and second surfaces 1 and 2, connected to the third and fourth surfaces 3 and 4, and opposing each other in the Y direction. In this exemplary embodiment, the first surface 1 may be a mounting surface.

The dielectric layer 111 may include a ceramic material having a high dielectric constant, such as barium titanate ($BaTiO_3$) based ceramic powder particles or the like. However, the present disclosure is not limited thereto.

In addition, the dielectric layer 111 may further include a ceramic additive, an organic solvent, a plasticizer, a binder, a dispersant and the like, in addition to the ceramic powder particles. The ceramic additive may use, for example, a transition metal oxide or a transition metal carbide, a rare earth element, magnesium (Mg), aluminum (Al) or the like.

The first and second internal electrodes 121 and 122, which are electrodes having different polarities, may be alternately disposed to oppose each other in the Z direction, while having the dielectric layer 111 interposed therebetween, and one end of the first or second internal electrode 121 or 122 may be exposed through the third or fourth surface 3 or 4 of the capacitor body 110.

Here, the first and second internal electrodes 121 and 122 may be electrically separated from each other by the dielectric layer 111 interposed therebetween.

The ends of the first and second internal electrodes 121 and 122 alternately exposed through the third and fourth surfaces 3 and 4 of the capacitor body 110 in this manner may be electrically connected to the first and second external electrodes 131 and 132 respectively disposed on the third and fourth surfaces 3 and 4 of the capacitor body 110 to be described below.

Here, the first and second internal electrodes 121 and 122 may each be formed of a conductive metal, for example, a material such as nickel (Ni), a nickel (Ni) alloy or the like. However, the present disclosure is not limited thereto.

Based on the above configuration, when a predetermined voltage is applied to the first and second external electrodes 131 and 132, electric charges may be accumulated between the first and second internal electrodes 121 and 122 opposing each other.

Here, the electronic component 100 may have capacitance proportional to an area of overlap of the first and second internal electrodes 121 and 122, in which the internal electrodes overlap each other in the Z direction.

The first and second external electrodes 131 and 132 may be disposed on the first surface 1, which is the mounting surface of the capacitor body 110, while being spaced apart from each other, may have voltages of different polarities, and may respectively be electrically connected to exposed portions of the first and second internal electrodes 121 and 122.

A plating layer may be formed on each surface of the first and second external electrodes 131 and 132, if necessary.

For example, the first and second external electrodes 131 and 132 may each include first and second conductive layers, first and second nickel (Ni) plating layers formed on the first and second conductive layers, and first and second tin (Sn) plating layers formed on the first and second plating layers.

The first external electrode 131 may include a first connection portion 131a and a first band portion 131b.

The first connection portion 131a may be a portion which is formed on the third surface 3 of the capacitor body 110 and connected to the first internal electrode 121, and the first band portion 131b may be a portion which is extended from the first connection portion 131a to a portion of the first surface 1 which is the mounting surface of the capacitor body 110 and to which the first connection terminal 141 is connected.

Here, the first band portion 131b may be further extended to a portion of the fifth or sixth surface 5 or 6 of the capacitor body 110 if necessary to have an improved fixing strength or the like.

In addition, the first band portion 131b may be further extended to a portion of the second surface 2 of the capacitor body 110 if necessary.

The second external electrode 132 may include a second connection portion 132a and a second band portion 132b.

The second connection portion 132a may be a portion which is formed on the fourth surface 4 of the capacitor body 110 and connected to the second internal electrode 122, and the second band portion 132b may be a portion which is extended from the second connection portion 132a to a portion of the first surface 1 which is the mounting surface of the capacitor body 110 and to which the second connection terminal 142 is connected.

Here, the second band portion 132b may be further extended to a portion of the fifth or sixth surface 5 or 6 of the capacitor body 110 if necessary to have an improved fixing strength or the like.

In addition, the second band portion 132b may be further extended to a portion of the second surface 2 of the capacitor body 110 if necessary.

The first and second connection terminals 141 and 142 may respectively be disposed to be connected to the first and second external electrodes 131 and 132.

In this exemplary embodiment, the first and second connection terminals 141 and 142 may be formed on the first and second external electrodes 131 and 132 to respectively correspond to the first and second band portions 131b and 132b formed on the first surface 1 of the capacitor body 110.

Here, the first connection terminal 141 may have a length in the X direction longer than a length of the first band portion 131b in the X direction, and the second connection terminal 142 may have a length in the X direction longer than a length of the second band portion 132b in the X direction.

A portion of the first or second connection terminal 141 or 142 may thus be positioned under the first surface 1 of the capacitor body 110.

In this exemplary embodiment, the first or second connection terminal 141 or 142 may serve to protect a multilayer capacitor against external impact applied to bend the capacitor, and may thus suppress or reduce cracks and delaminations occurring in the capacitor body 110.

The first or second connection terminal 141 or 142 may be formed of an insulating material such as an FR4 glass-reinforced epoxy laminate, a flexible printed circuit board (F-PCB), a ceramic material or a conductor material such as metal.

When formed of the insulating material, the first and second connection terminal 141 or 142 can have a land pattern of a conductor functioning as a signal terminal and a ground (GND) terminal on their upper and lower surfaces.

In more detail, the first connection terminal 141 of this exemplary embodiment may include a first conductive pattern formed on a surface of the first external electrode 131, facing the first band portion 131b, a second conductive pattern formed on a surface of the first external electrode 131, facing the first conductive pattern, and a third conductive pattern formed on at least a portion of a surface connecting the first and second conductive patterns to each other, and electrically connecting the first and second conductive patterns to each other.

In addition, the second connection terminal 142 may include a fourth conductive pattern formed on a surface of the second external electrode 132, facing the second band portion 132b, a fifth conductive pattern formed on a surface of the first external electrode 131, facing the fourth conductive pattern, and a sixth conductive pattern formed on at least a portion of a surface connecting the fourth and fifth conductive patterns to each other, and electrically connecting the fourth and fifth conductive patterns to each other.

For another example, when formed of the conductive material, the first or second connection terminal 141 or 142 may achieve the electrical connection through all surfaces.

The electronic component 100 of this exemplary embodiment may be a structure in which the multilayer capacitor is connected to the first and second connection terminals 141 and 142 having a shape of small boards disposed on an X-Y plane of the first and second external electrodes 131 and 132, while being spaced apart from each other.

Here, first and second external electrodes 131 and 132 may respectively be mounted on the first and second connection terminals 141 and 142 by first and second bonding portions 150 and 160.

That is, the first conductive bonding portion 150 may be disposed between the first band portion 131b of the first external electrode 131 and an upper surface of the first connection terminal 141.

Here, the first bonding portion 150 may be divided into a first-2-th region 152 (e.g., a second region) adjacent to a center of the capacitor body 110 in the X direction and a first-1-th region 151 (e.g., a first region) adjacent to the third surface 3 which is one end of the capacitor body 110.

In addition, the first-2-th region 152 may include a conductive resin, and the first-1-th region 151 may include a high melting point solder. For example, a high melting point solder may have a melting temperature of more than 250° C.

In addition, the conductive resin may include metal particles and epoxy, and the present disclosure is not limited thereto.

In addition, the first-1-th region 151 may be positioned to overlap a portion of the first band portion 131b in the Z direction, and the first-2-th region 152 may be positioned to overlap a portion of the first band portion 131b and a portion of the first surface 1 of the capacitor body 110, in the Z direction.

The first bonding portion 150 may be formed by forming the first-2-th region 152 by applying the conductive resin on the upper surface of the first connection terminal 141, and by simultaneously forming the first-1-th region 151 by applying the high melting point solder adjacent to the first-2-th region 152.

Here, the first-1-th region 151 and the first-2-th region 152 may be formed parallel to each other in the X direction so that there is no or minimized portion in which the two regions overlap each other in the Z direction.

In addition, the second bonding portion 160 may be divided into a second-2-th region 162 adjacent to the center of the capacitor body 110 in the X direction and a second-1-th region 161 adjacent to the fourth surface 4 which is the other end of the capacitor body 110.

In addition, the second-2-th region 162 may include the conductive resin, and the second-1-th region 161 may include the high melting point solder.

In addition, the conductive resin may include metal particles and epoxy, and the present disclosure is not limited thereto.

In addition, the second-1-th region 161 may be positioned to overlap a portion of the second band portion 132b in the Z direction, and the second-2-th region 162 may be positioned to overlap a portion of the second band portion 132b and a portion of the first surface 1 of the capacitor body 110, in the Z direction.

The second bonding portion 160 may be formed by forming the second-2-th region 162 by applying the conductive resin on an upper surface of the second connection terminal 142, and by simultaneously forming the second-1-th region 162 by applying the high melting point solder adjacent to the second-2-th region 162.

Here, the second-1-th region 161 and the second-2-th region 162 may be formed parallel to each other in the X direction so that there is no or minimized portion in which the two regions overlap each other in the Z direction.

A defective bending strength of the multilayer capacitor may indicate that when evaluating a bending strength of the multilayer capacitor, cracks occur in a portion of the capacitor body, which is bonded to a printed circuit board, thus destroying an active region including the internal electrode.

A main component of the capacitor body may be a dielectric such as ceramic, cracks may usually occur at an end of the external electrode attached to the capacitor body.

In this exemplary embodiment, the first and second connection terminals 141 and 142 may respectively be bonded to the first and second band portions 131b and 132b of the first and second external electrodes 131 and 132, thereby reducing stress applied externally from the capacitor, and thus suppressing occurrence of bending cracks.

Here, the first connection terminal 141 and the first band portion 131b may be bonded to each other by the first bonding portion 150, and the second connection terminal 142 and the second band portion 132b may be bonded to each other by the second bonding portion 160.

In this exemplary embodiment, the bonding portion may be divided into two regions, and high melting point solder or conductive resin may be used for the bonding portion. Here, the conductive resin may have the improved bending strength characteristic and increased equivalent series resistance (ESR). Meanwhile, the high melting point solder may have less increased ESR, and a lower bending strength characteristic than that of the conductive resin.

In this exemplary embodiment, the region of the bonding portion, adjacent to the center of the capacitor body, may be formed of the conductive resin having elasticity and flexibility, thereby increasing the bending strength of the end of the external electrode, vulnerable to the external impact.

In addition, the region of the bonding portion, adjacent to the end of the capacitor body, which is a relatively less vulnerable portion of the capacitor body to the external impact, may be formed using the high melting point solder to minimize an increase in the ESR.

In this exemplary embodiment, 0.25 to 0.9 may be a value range of T2/(T2+T1) when T1 indicates a length of the first-1-th region 151 and T2 indicates a length of the first-2-th region 152, of the first bonding portion 150 in the X direction.

Hereinafter, the description describes the first connection terminal as an example. However, the description of the first connection terminal includes a description of the second connection terminal because the second connection terminal has a shape and structure substantially similar to those of the first connection terminal, except that the second connection terminal is bonded to the second band portion.

For example, to measure lengths, widths, and thicknesses of the portions, regions, body, terminals, and electrodes, a scanning electron microscope (SEM), a transmission electron microscope (TEM), or an optical microscope may be used. Here, T1 and T2 may be obtained by measuring the lengths of the first-1-th region 151 and the first-2-th region 152 on the upper surface of the first bonding portion 150 in the Z direction, based on an interface where the first-1-th region 151 and the first-2-th region 152 are connected to each other, dividing the interface into five points in the Y direction, measuring the lengths of the first-1-th region 151 and the first-2-th region 152 at each of five points in the X direction, and averaging the five measured lengths.

T2/(T1+T2) may indicate an application ratio of the conductive epoxy to an entire bonding portion. Here, when T2/(T1+T2) has an increased value, the multilayer capacitor may have the improved bending strength, and the increased equivalent series resistance (ESR) value. On the contrary, when T2/(T1+T2) has a reduced value, the multilayer capacitor may have the less increased bending strength as the lower equivalent series resistance (ESR) value.

As such, there is a trade-off relationship between the bending strength and the ESR value, based on the application ratio of the conductive epoxy to the entire bonding portion. Hereinafter, the description thus describes a confirmed proper application ratio of the conductive epoxy through an experiment.

Table 1 and FIG. 5 below show a test result of a bending deformation of the capacitor, based on a numerical value of T2/(T2+T1).

The multilayer capacitor used in each sample is 3.2 mm long in the X direction, 2.5 mm long in the Y direction, 2.5 mm high, and manufactured to have an electrical characteristic of 4.7 uF.

In addition, only the conductive layer including copper is first applied to the external electrode.

Table 1 shows a result of a test performed by preparing a total of 60 chips including 30 chips of a horizontal mounting type and 30 chips of a vertical mounting type for each sample, mounting each chip on the PCB after 100 cycles of −55 to 125° C. temperature, and observing whether the band portion of the connection terminal or the external electrode is separated from the capacitor body while increasing the bending deformation strength. The separation may be observed visually or via an optical microscope.

TABLE 1

| # | 1 | 2 | 3 | 4 | 5 | 6 |
|---|---|---|---|---|---|---|
| T2/(T2 + T1) | — | 0 | 0.25 | 0.50 | 0.75 | 1.00 |
| Average bending strength (mm) | 5.26 | 6.54 | 7.35 | 7.67 | 8.09 | 9.64 |
| Maximum bending strength (mm) | 6.75 | 8.09 | 8.72 | 9.32 | 9.60 | 11.32 |
| Minimum bending strength (mm) | 3.70 | 5.19 | 6.14 | 6.10 | 6.80 | 7.70 |
| Standard deviation | 0.62 | 0.78 | 0.82 | 0.83 | 0.73 | 0.88 |

6 mm is a minimum length which guarantees a normally required bending strength of the multilayer capacitor, and an effect of preventing bending cracks from occurring when connecting the connection terminal to the body is required to satisfy a level equal to or higher than this guaranteed bending strength.

Figure 5:
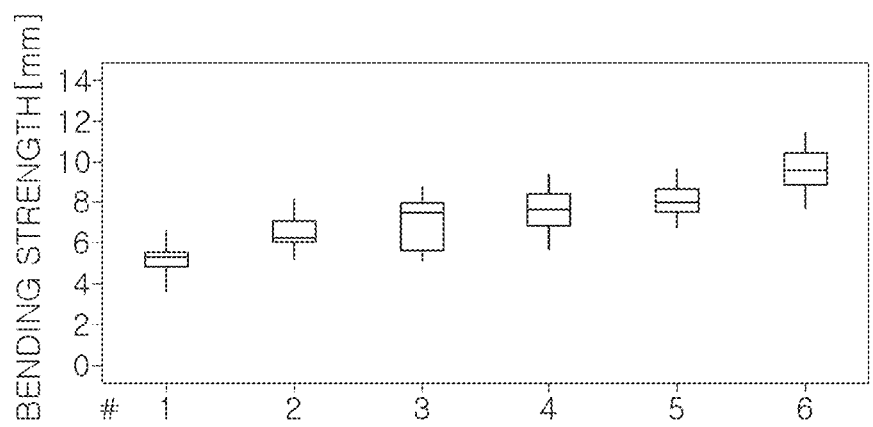
FIG. 5 is a graph illustrating a test of a bending strength of the electronic component by changing an application rate of conductive epoxy at a bonding portion.

Referring to Table 1 and FIG. 5, #1 is a comparative example showing a single-unit multilayer capacitor to which no connection terminal is bonded. In this case, it is confirmed that the 6 mm guarantee is not formed because a peak occurs at a point having an average of 5.26 mm when evaluating the bending strength.

In addition, #2 is a case in which the capacitor includes the connection terminal, and the bonding portion is formed of only the high melting point solder without the conductive epoxy. In this case, it is confirmed that the 6 mm guarantee is not formed because the average bending strength is 6.54 mm which exceeds a standard value of 6 mm and the peak occurs at a point at which the minimum bending strength is 5.19 mm.

In addition, from #3 which is a case in which 25% is the ratio of the conductive epoxy included in the bonding portion to #5 which is a case in which 75% is the ratio, an average point at which the peak occurs gradually increases from 7.35 mm to 8.09 mm, and a minimum point at which the peak occurs gradually increases from 6.14 mm to 6.80 mm. It can thus be seen that both the average bending strength and the minimum bending strength are guaranteed to be 6 mm.

In addition, #6 is a case in which the bonding portion is formed of only the conductive epoxy. In this case, the average bending strength is 9.64 mm, and the peak occurs at a point at which the minimum bending strength is 7.70 mm. It can thus be seen that when the ratio of the conductive epoxy increases, the bending strength characteristic is gradually improved.

As such, it can be seen that the bending strength characteristic of the multilayer capacitor may be improved by increasing the ratio of the conductive epoxy used in the bonding portion, and 0.25 is a lower limit value of $T2/(T2+T1)$ when the bonding portion is formed of a combination of the conductive epoxy and the high melting point solder.

Table 2 below shows that a change in the equivalent series resistance (ESR) of the multilayer capacitor is measured based on the value of $T2/(T2+T1)$ in the bonding portion. Here, the multilayer capacitor used for the test uses the same specifications as those used for the test of bending strength in Table 1 above.

In this experimental example, the ESR value is measured using an LCR meter (E4980A). When measuring the ESR value by using a tweezers contact probe, dispersion of a result value may be wide, based on a change in a measuring position and force. Therefore, in this experiment, the ESR value is measured and evaluated using a SMD fixture type probe.

TABLE 2

| # | 2 | 3 | 4 | 5 | 6 | 7 |
|---|---|---|---|---|---|---|
| T2/(T2 + T1) | 0 | 0.25 | 0.50 | 0.75 | 0.9 | 1.00 |
| Average ESR (MΩ) | 4.17 | 5.37 | 7.17 | 8.09 | 9.17 | 9.45 |
| Maximum ESR (MΩ) | 5.17 | 6.91 | 8.17 | 9.27 | 9.91 | 10.80 |
| Minimum ESR (MΩ) | 2.17 | 3.94 | 5.81 | 6.17 | 7.89 | 7.97 |

10 MΩ is a normally required ESR value of the multilayer capacitor, and the ESR of the multilayer capacitor to which the connection terminal is bonded may thus also be required to satisfy a level equal to or lower than this reference value.

Referring to Table 2, when the ratio of $T2/(T2+T1)$ is zero and the bonding portion is formed of only the high melting point solder without the conductive epoxy, #2 shows that an average ESR is 4.17 MΩ and a maximum ESR is 5.17 MΩ.

In addition, #7 is a case in which the ratio of $T2/(T2+T1)$ is 1.00 and the bonding portion is formed of only the conductive epoxy. In this case, the average ESR is 9.45 MΩ and the maximum ESR is 10.80 MΩ, which exceeded the reference value.

In addition, #6 is a case in which the ratio of $T2/(T2+T1)$ is 0.9, the ratio of the conductive epoxy in the bonding portion is 90%, and the ratio of the high melting point solder is 10%. In this case, the average ESR is 9.17 MΩ and the maximum ESR is 9.91 MΩ, both of which are measured within the reference value.

Therefore, when the bonding portion is formed of a combination of the conductive epoxy and the high melting point solder, it can be seen that 0.9 is an upper limit value of $T2/(T2+T1)$.

As shown in Table 1, Table 2 and FIG. 5, it can be seen that 0.25 to 0.9 is a value range of $T2/(T2+T1)$, which may minimize the increase in the ESR while securing the bonding strength of the electronic component of this exemplary embodiment.

Figure 6:
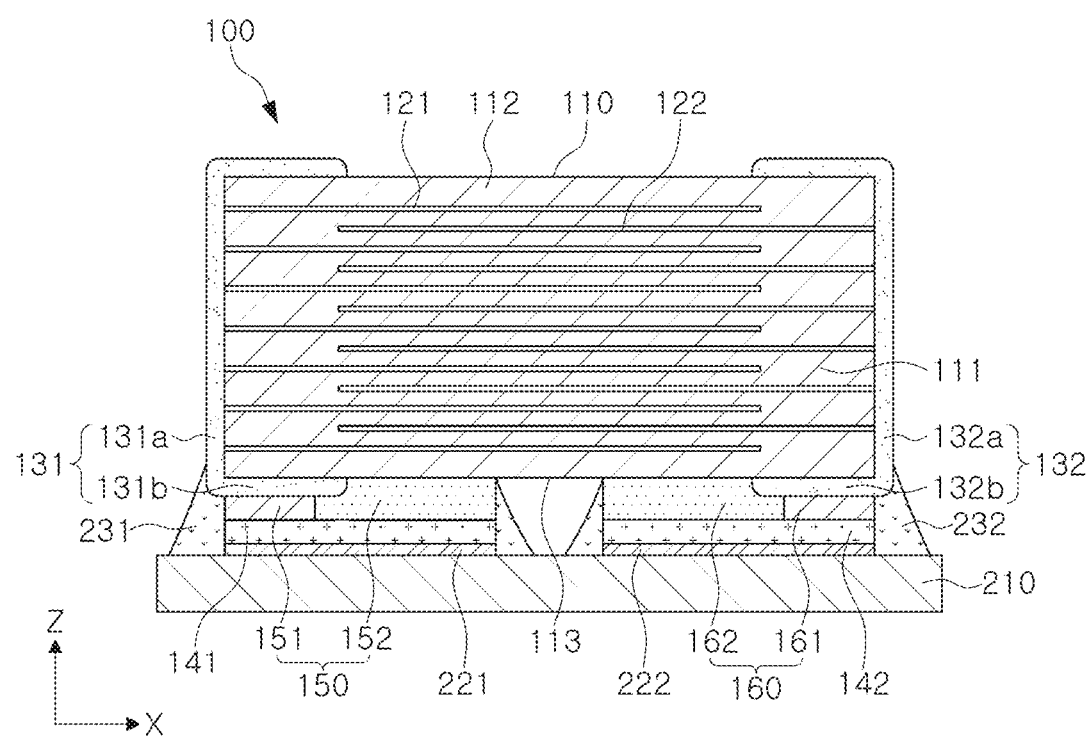
FIG. 6 is a cross-sectional view schematically illustrating that the electronic component of FIG. 1 is mounted on a board.

FIG. 6 is a cross-sectional view schematically illustrating that the electronic component of FIG. 1 is mounted on a board.

Referring to FIG. 6, the board having the electronic component mounted thereon according to this exemplary embodiment may include a board 210 having first and second electrode pads 221 and 222 disposed on one surface thereof, and the electronic component 100 mounted on an upper surface of the board 210 for the first and second connection terminals 141 and 142 are respectively connected to the first and second electrode pads 221 and 222, and fixed by solders 231 and 232.

Figure 7:
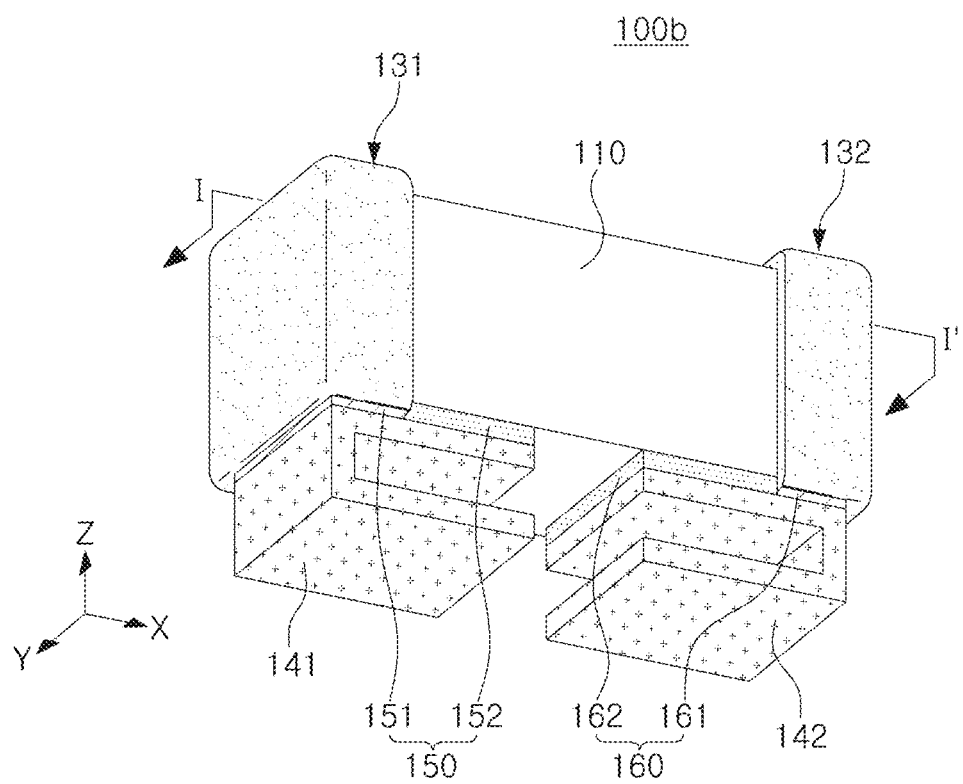
FIG. 7 is a perspective view schematically illustrating a modified shape of the first and second connection terminals of an electronic component according to another exemplary embodiment of the present disclosure.
Figure 8:
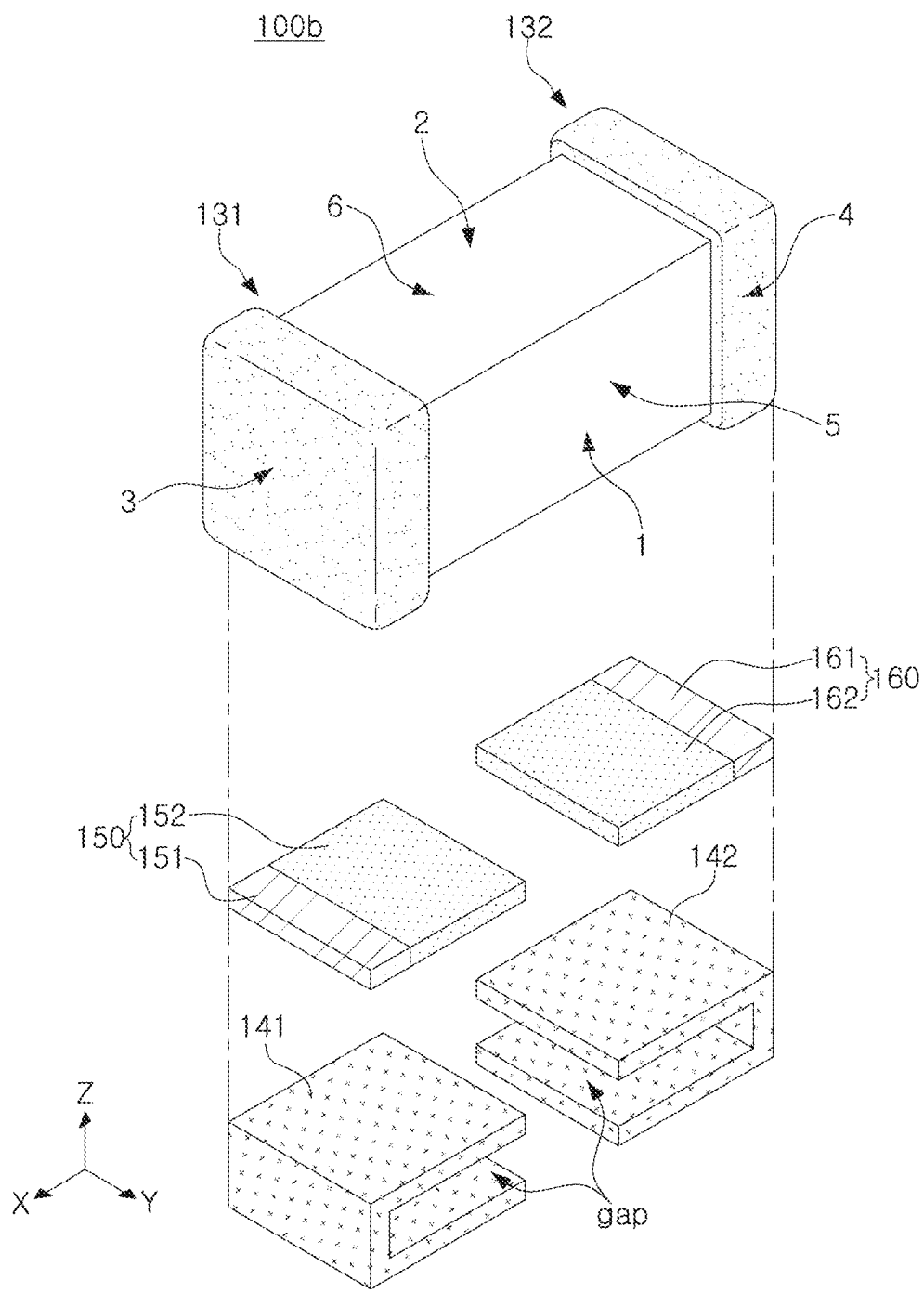
FIG. 8 is an exploded perspective view of FIG. 7.

FIG. 7 is a perspective view schematically illustrating a modified shape of the first and second connection terminals of an electronic component according to another exemplary embodiment of the present disclosure; FIG. 8 is an exploded perspective view of FIG. 7; and FIG. 9 is a cross-sectional view taken along line I-I' of FIG. 7.

Figure 9:
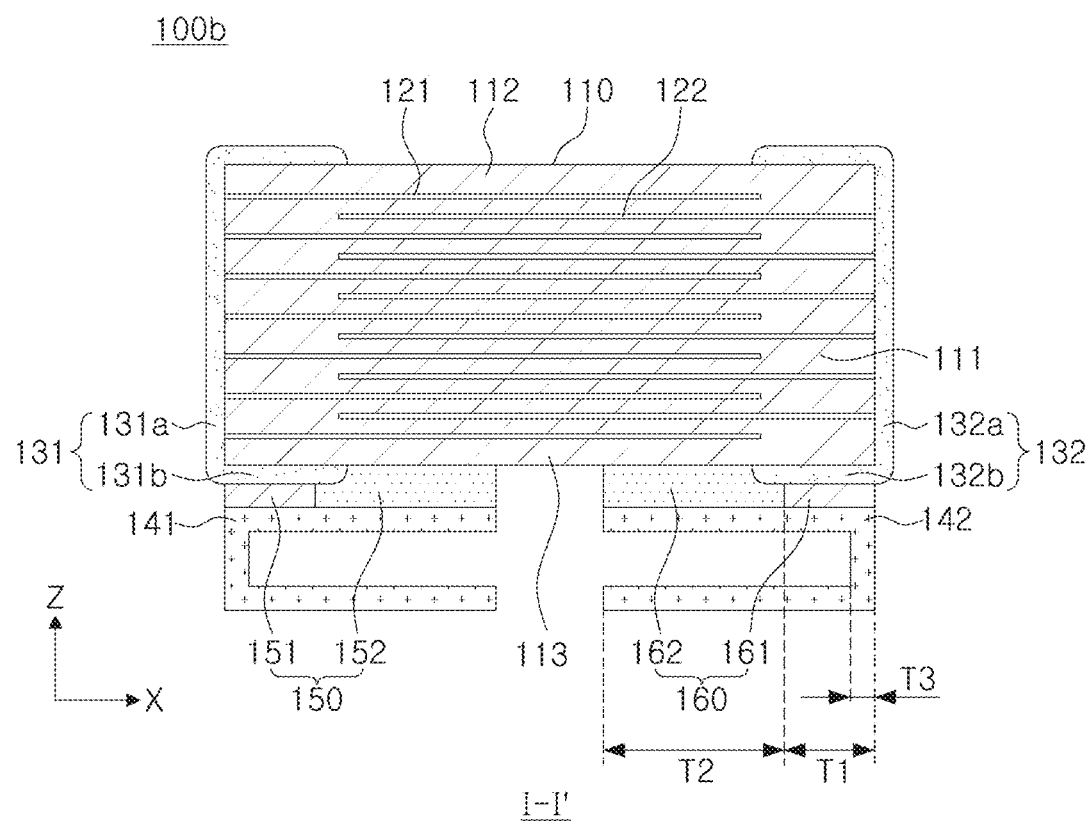
FIG. 9 is a cross-sectional view taken along line I-I' of FIG. 7.

Referring to FIGS. 7, 8 and 9, the first and second connection terminals 141 and 142 of an electronic component 100b according to another embodiment of the present disclosure may each include a gap formed between one and another portions thereof.

When a force for bending the capacitor body 110 is applied to the capacitor body 110, the force may be partially applied to change the size or shape of the gap of each of the first and second connection terminals 141 and 142. The force for bending the capacitor body 110 may thus be reduced, thereby improving the bending strength characteristic of the capacitor body 110.

For example, when the first and second connection terminals 141 and 142 are each formed of the conductor material such as the metal, the force for bending the capacitor body 110 may be partially neutralized by strong strengths of the first and second connection terminals 141 and 142, and the force for bending the capacitor body 110 may thus be reduced.

For example, when the first and second connection terminals 141 and 142 are each formed of the insulating material such as the FR4 glass-reinforced epoxy laminate, the flexible printed circuit board (F-PCB), the ceramic material, the force for bending the capacitor body 110 may be partially dissipated by flexibly changing the size or shape of the gap of each of the first and second connection terminals 141 and 142, and the force for bending the capacitor body 110 may thus be reduced.

For example, at least a portion of each of the first and second connection terminals 141 and 142 may have a U-shape, and the U-shape of the first connection terminal 141 and the U-shape of the second connection terminal 142 may be open toward each other.

Accordingly, a distance between respective centers of the gaps of the first and second connection terminals 141 and 142 may be closer than a distance between respective centers of the first and second connection terminals 141 and 142. The gap of the first connection terminal 141 may be closer to the first-2-th region 152 than the first-1 region 151 of the bonding portion 150, and the gap of the second connection terminal 142 may be closer to the second-2-th region 162 than the second-1 region 161 of the second bonding portion 160.

The first-1-th region 151 and the second-1-th region 161 may be more advantageous in improving the equivalent series resistance (ESR) characteristic due to relatively high conductivity, and the first-2-th region 152 and the second-2-th region 162 may be more advantageous in improving the bending strength characteristic due to relatively high flexibility. A portion connecting the upper and lower portions of the first or second connection terminal 141 or 142 can act as an electrical connection path, and may thus be positioned relatively adjacent to the first-1-th region 151 or the second-1-th region 161 to efficiently improve the ESR characteristic. A mechanism of improving the bending strength characteristic of the first-2-th region 152 and the second-2-th region 162 can achieve the high efficiency because the gap of the first or second connection terminal 141 or 142 is positioned relatively adjacent to the first-2-th region 152 or the second-2-th region 162.

That is, the bending strength characteristic improvement efficiency and the ESR characteristic improvement efficiency of the electronic component 100b according to an exemplary embodiment of the present disclosure may be improved together.

Meanwhile, based on a design, each of the first and second connection terminals 141 and 142 may have a shape (e.g., N shape) with an additional shape (e.g., L shape) added to the U-shape, a U-shape having a rounded corner (i.e., boundary line forming an angle in the first or second connection terminal 141 or 142 of FIGS. 7, 8 and 9), or a U-shape in which a portion connecting the upper and lower portions of the first or second connection terminal 141 or 142 is curved to have an edge radius.

For example, T3 may be shorter than T1 when T1 indicates the length of the first-1-th region 151 or second-1-th region 161 and T3 indicates each thickness of the first and second connection terminals 141 and 142, in a direction (e.g., X direction) in which the first and second external electrodes 131 and 132 are connected to each other.

Accordingly, there may be a high possibility in which an edge of the first or second band portion 131b or 132b of the first or second external electrode 131 or 132 overlaps the gap of the first or second connection terminal 141 or 142 in the Z direction. The edge of the first or second band portion 131b or 132b may be highly likely to be a point at which cracks start to occur as the capacitor body 110 is greatly bent. When T3 is shorter than T1, force acting at the point at which the crack is highly likely to occur can be efficiently distributed, thus reducing the possibility in which the cracks occur when the capacitor body 110 is bent, and improving the bending strength of the capacitor body 110.

Figure 10A:
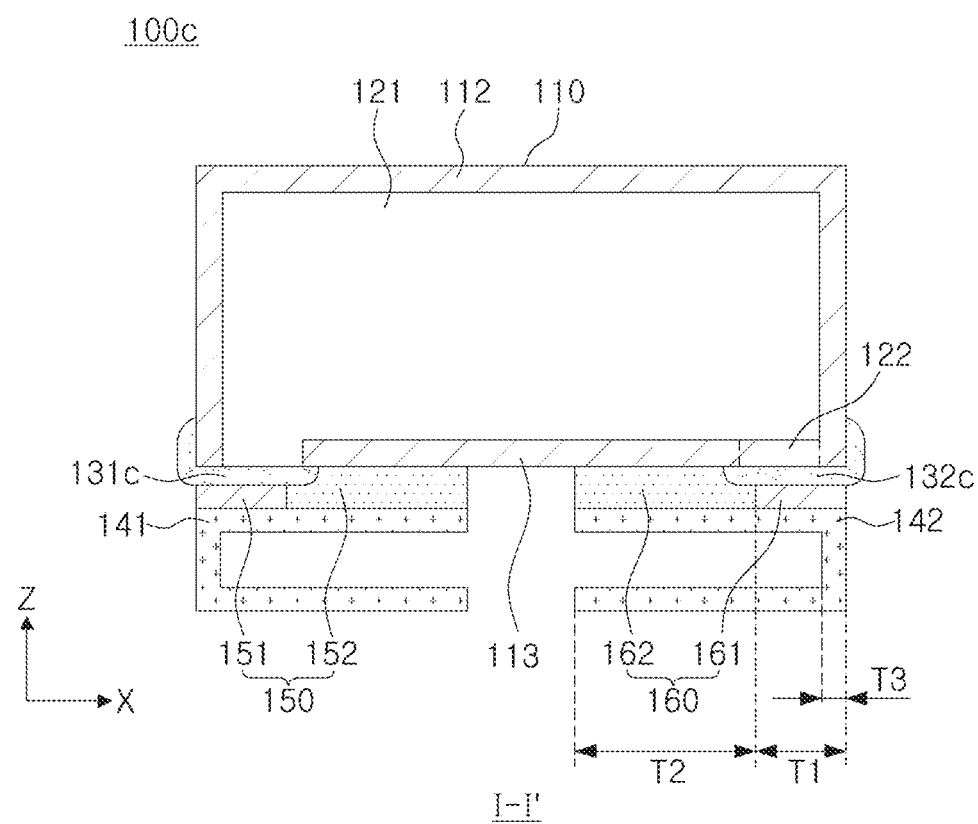
FIGS. 10A and 10B are cross-sectional views respectively illustrating a modified shape of first and second internal electrodes of an electronic component according to yet another exemplary embodiment of the present disclosure.
Figure 10B:
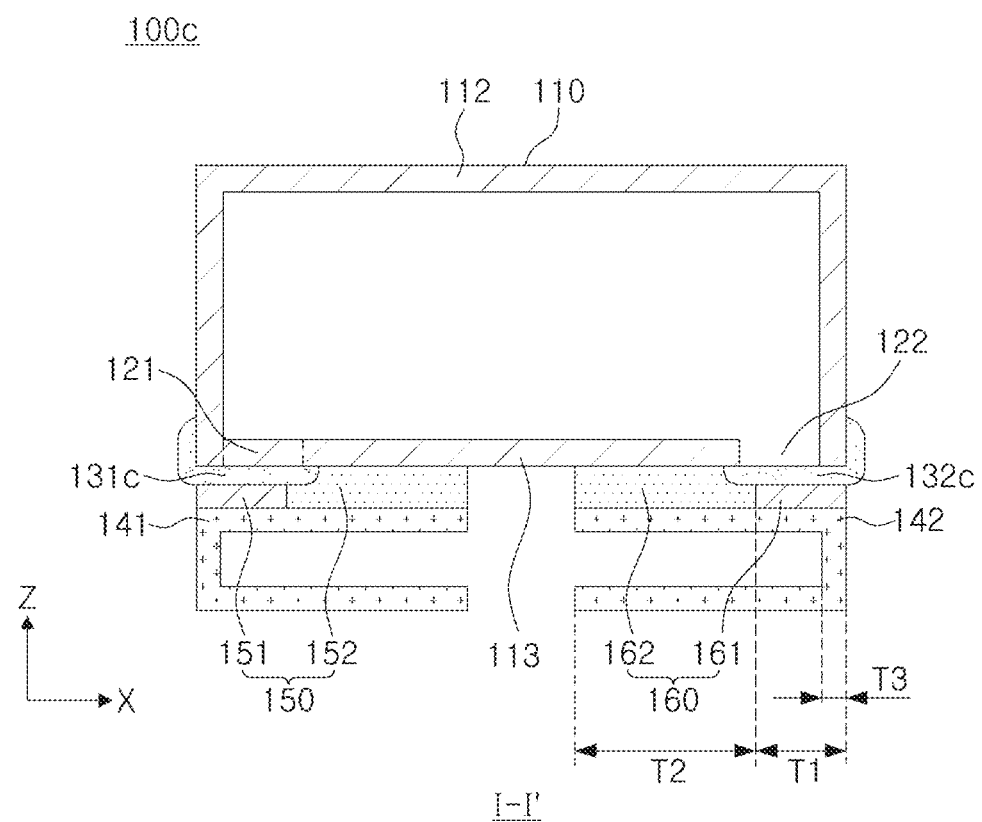
Figure 11:
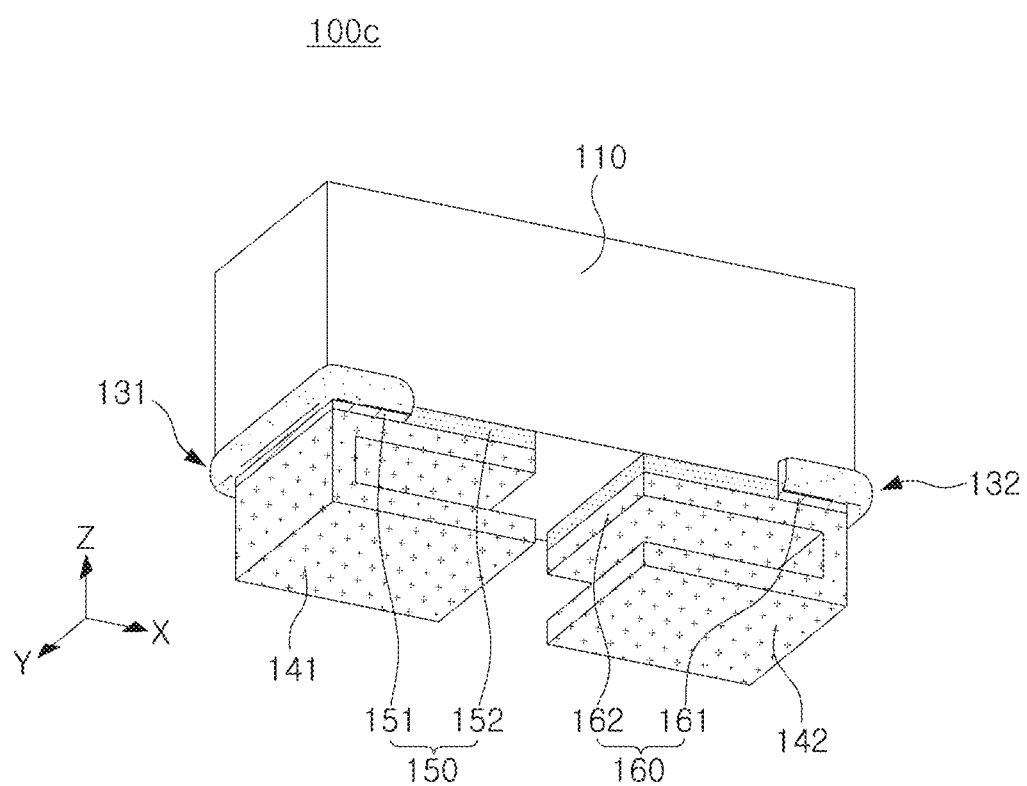
FIG. 11 is a perspective view schematically illustrating the modified shape of the first and second external electrodes of the electronic component according to yet another exemplary embodiment of the present disclosure.

FIGS. 10A and 10B are cross-sectional views respectively illustrating a modified shape of first and second internal electrodes of an electronic component according to yet another exemplary embodiment of the present disclosure; and FIG. 11 is a perspective view schematically illustrating the modified shape of the first and second external electrodes of the electronic component according to yet another exemplary embodiment of the present disclosure.

Referring to FIGS. 10A, 10B and 11, one end of the first or second internal electrode 121 or 122 of an electronic component 100c according to yet another embodiment of the present invention may be exposed through the mounting surface of capacitor body 110 (corresponding to the first surface 1 in FIG. 2). The third surface (3 in FIG. 2), the fourth surface (4 in FIG. 2), the fifth surface (5 in FIG. 2) and the sixth surface (6 in FIG. 2) of the capacitor body 110, may each include a portion where first or second external electrode 131c or 132c is not disposed. For example, the plurality of first and second internal electrodes 121 and 122 may be alternately stacked in the Y direction.

When the first or second internal electrode 121 or 122 is exposed through the mounting surface (corresponding to the first surface 1 in FIG. 2) of the capacitor body 110, an entire path through which the capacitance formed by the first or second internal electrode 121 or 122 is provided to the first or second connection terminal 141 or 142 may be shorter. Accordingly, the electronic component 100c according to an exemplary embodiment of the present disclosure may further improve the ESR characteristic.

In addition, the first or second internal electrode 121 or 122 may not be exposed to the third, fourth, fifth or sixth surface of the capacitor body 110 (3, 4, 5 or 6 in FIG. 2), thus reducing necessity to dispose the first or second external electrode 131c or 132c on the third, fourth, fifth or sixth surface (3, 4, 5 or 6 of FIG. 2) (e.g., to be connected to the internal electrode). Accordingly, the first or second internal electrode 121 or 122 and the third, fourth, fifth or sixth surface (3, 4, 5 or 6 of FIG. 2) of the capacitor body 110 may have a smaller margin therebetween because there is no need to consider an insulation between the first external electrode 131c and the second internal electrode 122 or an insulation between the second external electrode 132c and the first internal electrode 121. Accordingly, it is possible to increase the area in which the first and second internal electrodes 121 and 122 overlap each other, and improve the capacitance of the capacitor body 110 compared to its size.

An importance of improving the bending strength against the force for bending the capacitor body 110 in the Z direction may be higher due to a structure of the first and second internal electrodes 121 and 122 of the electronic component 100c according to an exemplary embodiment of the present disclosure. The structure of the first and second bonding portions 150 and 160 of the electronic component 100c and the gap of the first or second connection terminal 141 or 142 can be effective in improving the bending strength of the capacitor body 110 against the force for bending the capacitor body 110 in the Z direction, thus improving its bending strength characteristic and capacitance together.

Meanwhile, based on the design, the shape of the first or second internal electrode 121 or 122 and the shape of the first or second external electrode 131c or 132c, shown in FIGS. 10A, 10B and 11, can also be applied to the electronic component 100 according to an exemplary embodiment of the present disclosure of FIGS. 1 through 4.

Table 3 and FIG. 12 below show the test result of the bending deformation, based on numerical values of T2/(T2+T1) of five samples of the electronic component 100c according to yet another exemplary embodiment of the present disclosure. A horizontal axis of FIG. 12 indicates the order number # of the sample. Here, the multilayer capacitor used for the test uses the same specifications as those used for the test of the bending strength of Tables 1 and 2 above, and a process of testing the bending strength is the same as that of Table 1.

TABLE 3

| # | 1 | 8 | 9 | 10 | 11 | 12 |
|---|---|---|---|---|---|---|
| T2/(T2 + T1) | — | 0 | 0.25 | 0.50 | 0.75 | 1.00 |
| Average bending strength (mm) | 5.26 | 7.14 | 7.95 | 8.27 | 8.69 | 10.24 |
| Maximum bending strength (mm) | 6.75 | 8.69 | 9.32 | 9.92 | 10.20 | 11.92 |
| Minimum bending strength (mm) | 3.70 | 5.79 | 6.74 | 6.70 | 7.40 | 8.30 |
| Standard deviation | 0.62 | 0.78 | 0.82 | 0.83 | 0.73 | 0.88 |

6 mm is the minimum length which guarantees the normally required bending strength of the multilayer capacitor, and the effect of preventing the bending cracks from occurring when connecting the connection terminal to the body is required to satisfy the level equal to or higher than this guaranteed bending strength.

Figure 12:
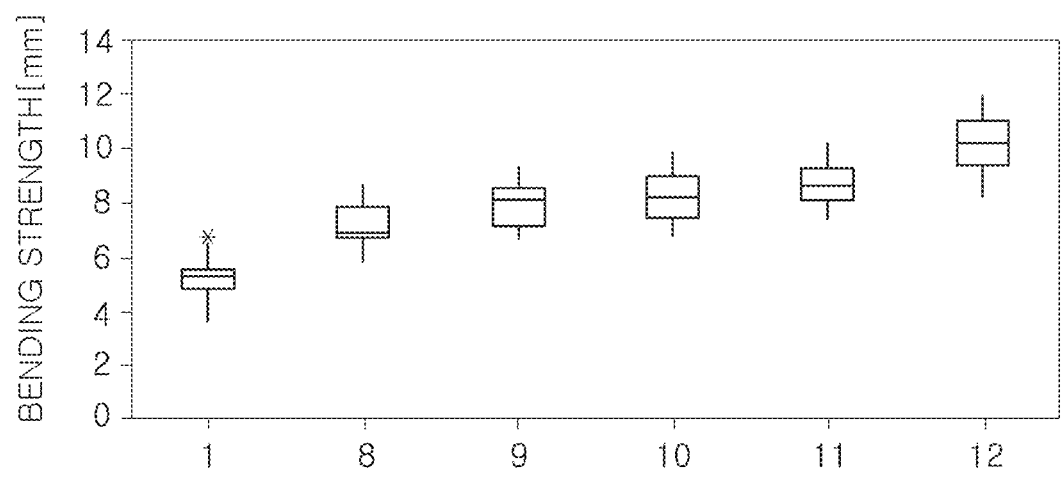
FIG. 12 is a graph illustrating a test of a bending strength of an electronic component 100c of FIG. 10A through 11 by changing the application rate of the conductive epoxy at the bonding portion.

Referring to Table 3 and FIG. 12, #1 is a comparative example showing the single-unit multilayer capacitor to which no connection terminal is bonded, and is the same as #1 in Tables 1 and FIG. 5.

In addition, #8 is a case in which the capacitor includes the connection terminal, and the bonding portion is formed of only the high melting point solder without the conductive epoxy. In this case, it is confirmed that the 6 mm guarantee is not formed because the average bending strength is 7.14 mm which exceeds the standard value of 6 mm and the peak occurs at a point at which the minimum bending strength is 5.79 mm.

In addition, from #9 in which 25% is the ratio of the conductive epoxy included in the bonding portion to #11 in which 75% is the ratio, an average point at which the peak occurs gradually increases from 7.95 mm to 8.69 mm, and a minimum point at which the peak occurs gradually increases from 6.74 mm to 7.40 mm. It can thus be seen that both the average bending strength and the minimum bending strength are guaranteed to be 6 mm.

In addition, #12 is a case in which the bonding portion is formed of only the conductive epoxy. In this case, the average bending strength is 10.24 mm, and the peak occurs at a point at which the minimum bending strength is 8.30 mm. It can thus be seen that when the ratio of the conductive epoxy increases, the bending strength characteristic is gradually improved.

As such, it can be seen that the bending strength characteristic of the multilayer capacitor may be improved by increasing the ratio of the conductive epoxy used in the bonding portion, and 0.25 is a lower limit value of T2/(T2+T1) when the bonding portion is formed of the combination of the conductive epoxy and the high melting point solder.

Like the electronic component 100 according to an exemplary embodiment of the present disclosure of FIGS. 1 through 4, 0.25 is the lower limit value of T2/(T2+T1) of the electronic component 100c according to yet another exemplary embodiment of the present disclosure of FIGS. 10A, 10B and 11.

Figure 13:
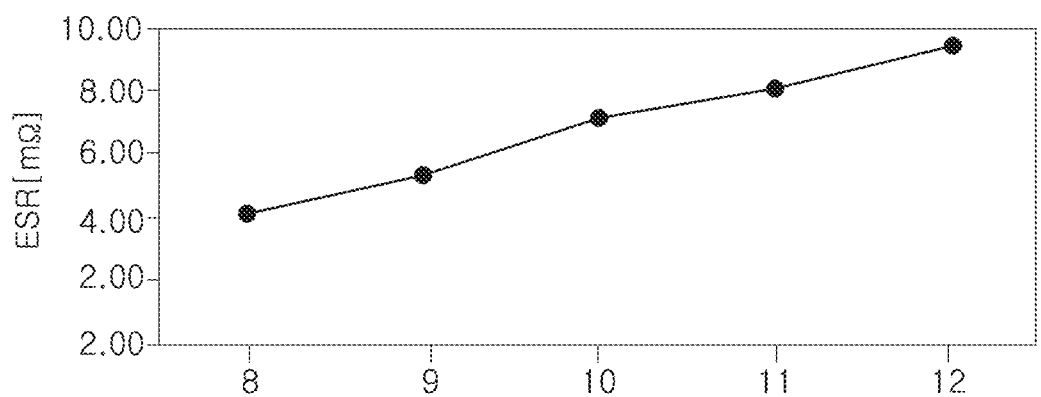
FIG. 13 is a graph illustrating a test of equivalent series resistance (ESR) of the electronic component 100c of FIGS. 10A through 11 by changing the application rate of the conductive epoxy at the bonding portion.

FIG. 13 shows a change in the equivalent series resistance (ESR) of the multilayer capacitor, based on the value of T2/(T2+T1), measured at the bonding portion of the five samples of the electronic component 100c according to yet another exemplary embodiment of the present disclosure. Here, the multilayer capacitor used for the test uses the same specifications as those used for the test of the bending strength of Tables 1, 2 and 3 above, and a process of measuring the ESR is the same as that of Table 2.

10 MΩ is the normally required ESR value of the multilayer capacitor, and the ESR of the multilayer capacitor to which the connection terminal is bonded may thus also be required to satisfy a level equal to or lower than this reference value.

Referring to FIG. 13, when the ratio of T2/(T2+T1) is zero and the bonding portion is formed of only the high melting point solder without the conductive epoxy, #8 to #11 show that the average ESR is less than 10 MΩ. A difference between the maximum ESR and the average ESR may not be large, and the maximum ESR may thus also be less than 10 MΩ.

In addition, #12 is a case in which the ratio of T2/(T2+T1) is 1.00 and the bonding portion is formed of only the conductive epoxy. In this case, the average ESR can be adjacent to 10 MΩ. The difference between the average ESR and the maximum ESR may not be small, and the maximum ESR may exceed 10 MΩ.

That is, an entire pattern of the ESR characteristic of FIG. 13 may be similar to the pattern of the ESR characteristic of Table 2. Accordingly, like the electronic component 100 according to an exemplary embodiment of the present disclosure of FIGS. 1 through 4, 0.9 may be an upper limit value of T2/(T2+T1) of the electronic component 100c according to yet another exemplary embodiment of the present disclosure, shown in FIGS. 10A, 10B and 11.

As set forth above, according to an exemplary embodiment of the present disclosure, it is possible to effectively prevent the bending cracks from occurring in the electronic component when the electronic component is mounted on the board.

While the exemplary embodiments have been shown and described above, it will be apparent to those skilled in the art that modifications and variations could be formed without departing from the scope of the present disclosure as defined by the appended claims.

What is claimed is:

1. An electronic component comprising:
    a capacitor body;
    first and second external electrodes disposed on a mounting surface of the capacitor body, while being spaced apart from each other;
    first and second connection terminals respectively connected to the first and second external electrodes;
    a first bonding portion disposed between the first external electrode and the first connection terminal, and including a first-2-th region and a first-1-th region, the first-2-th region being adjacent to a center of the capacitor body and including a conductive resin, and the first-1-th region being adjacent to one end of the capacitor body and including a high melting point solder; and
    a second bonding portion disposed between the second external electrode and the second connection terminal, and including a second-2-th region and a second-1-th region, the second-2-th region being adjacent to the center of the capacitor body and including the conductive resin and the second-1-th region being adjacent to other end of the capacitor body and including the high melting point solder,
wherein the high melting point solder is disposed only in the first-1-th region and second-1-th region.

2. The electronic component of claim 1, wherein the capacitor body includes a plurality of dielectric layers and a plurality of first and second internal electrodes alternately disposed having the dielectric layer interposed therebetween, and includes first and second surfaces opposing each other, and third and fourth surfaces connected to the first and second surfaces and opposing each other, one end of the plurality of the first internal electrodes extends from the third or fourth surface.

3. The electronic component of claim 2, wherein the first and second external electrodes respectively include
first and second connection portions respectively disposed on the third and fourth surfaces of the capacitor body; and
first and second band portions respectively extended from the first and second connection portions to a portion of the first surface of the capacitor body, and respectively connected to the first and second connection terminals.

4. The electronic component of claim 3, wherein the first-1-th region is positioned below the first band portion,
the first-2-th region is positioned below the first band portion and the first surface of the capacitor body,
the second-1-th region is positioned below the second band portion, and
the second-2-th region is positioned below the second band portion and the first surface of the capacitor body.

5. The electronic component of claim 1, wherein 0.25 to 0.9 is a value range of T2/(T2+T1) when T1 indicates a length of the first-1-th region or second-1-th region and T2 indicates a length of the first-2-th region or second-2-th region, in a direction in which the first and second external electrodes oppose each other.

6. The electronic component of claim 1, further comprising a plating layer disposed on each surface of the first and second external electrodes.

7. The electronic component of claim 1, wherein the first connection terminal includes a first gap disposed between portions of the first connection terminal, and
the second connection terminal includes a second gap disposed between portions of the second connection terminal.

8. The electronic component of claim 7, wherein each of the first and second connection terminals has a U-shape, and the U-shape of the first connection terminal and the U-shape of the second connection terminal are open toward each other.

9. The electronic component of claim 7, wherein T3 is shorter than T1 when T1 indicates a length of the first-1-th region or second-1-th region and T3 indicates each thickness of the first and second connection terminals, in a direction in which the first and second external electrodes oppose each other.

10. The electronic component of claim 9, wherein 0.25 to 0.9 is a value range of T2/(T2+T1) when T2 indicates a length of the first-2-th region or second-2-th region, in the direction in which the first and second external electrodes oppose each other.

11. The electronic component of claim 7, wherein the capacitor body includes a plurality of dielectric layers and a plurality of first and second internal electrodes alternately disposed having the dielectric layer interposed therebetween, and includes third, fourth, fifth and sixth surfaces connected to the mounting surface, each of the third, fourth, fifth and sixth surfaces including a portion where the first or second external electrode is not disposed.

12. A board having an electronic component mounted thereon, the board comprising:
the electronic component including:
a capacitor body;
first and second external electrodes disposed on a mounting surface of the capacitor body, while being spaced apart from each other;
first and second connection terminals respectively connected to the first and second external electrodes;
a first bonding portion disposed between the first external electrode and the first connection terminal, and including a first-2-th region and a first-1-th region, the first-2-th region being adjacent to a center of the capacitor body and including a conductive resin, and the first-1-th region being adjacent to one end of the capacitor body and including a high melting point solder; and
a second bonding portion disposed between the second external electrode and the second connection terminal, and including a second-2-th region and a second-1-th region, the second-2-th region being adjacent to the center of the capacitor body and including the conductive resin and the second-1-th region being adjacent to other end of the capacitor body and including the high melting point solder,
wherein the high melting point solder is disposed only in the first-1-th region and second-1-th region,
wherein the board has first and second electrode pads disposed on one surface thereof, and
wherein the electronic component is mounted on the board for the first and second connection terminals, respectively connected to the first and second electrode pads.

13. The board of claim 12, wherein the capacitor body includes a plurality of dielectric layers and a plurality of first and second internal electrodes alternately disposed having the dielectric layer interposed therebetween, and includes first and second surfaces opposing each other, and third and fourth surfaces connected to the first and second surfaces and opposing each other, one end of the first or second internal electrode extending from the third or fourth surface.

14. The board of claim 13, wherein the first and second external electrodes respectively include
first and second connection portions respectively disposed on the third and fourth surfaces of the capacitor body; and
first and second band portions respectively extended from the first and second connection portions to a portion of the first surface of the capacitor body, and respectively connected to the first and second connection terminals.

15. The board of claim 14, wherein the first-1-th region is positioned below the first band portion,
the first-2-th region is positioned below the first band portion and the first surface of the capacitor body,
the second-1-th region is positioned below the second band portion, and
the second-2-th region is positioned below the second band portion and the first surface of the capacitor body.

16. The board of claim 15, wherein the first connection terminal includes a gap portions of the first connection terminal, and the second connection terminal includes a second gap disposed between portions of the second connection terminal.

17. The board of claim 16, wherein each of the first and second connection terminals has a U-shape, and the U-shape of the first connection terminal and the U-shape of the second connection terminal are open toward each other.

18. The board of claim 12, wherein the first connection terminal includes a gap between portions of the first connection terminal, the second connection terminal includes a second gap disposed between portions of the second connection terminal, and the capacitor body includes a plurality of dielectric layers and a plurality of first and second internal electrodes alternately disposed having the dielectric layer interposed therebetween, and includes third, fourth, fifth and sixth surfaces connected to the mounting surface, each of the third, fourth, fifth and sixth surfaces including a portion where the first or second external electrode is not disposed.

19. The board of claim 18, wherein T3 is shorter than T1 and 0.25 to 0.9 is a value range of T2/(T2+T1) when T1 indicates a length of the first-1-th region or second-1-th region, T2 indicates a length of the first-2-th region or second-2-th region, and T3 indicates each thickness of the first and second connection terminals, in a direction in which the first and second external electrodes oppose each other.

20. The board of claim 12, wherein 0.25 to 0.9 is a value range of T2/(T2+T1) when T1 indicates a length of the first-1-th region or second-1-th region and T2 indicates a length of the first-2-th region or second-2-th region, in a direction in which the first and second external electrodes oppose each other.

21. An electronic component comprising:
a capacitor body;
first and second external electrodes disposed on a mounting surface of the capacitor body;
first and second connection terminals connected to the first and second external electrodes, respectively;
a first bonding portion disposed between the first external electrode and the first connection terminal; and
a second bonding portion disposed between the second external electrode and the second connection terminal,
wherein at least one of the first and second bonding portions include a first region including a high melting point solder and a second region including a conductive resin, and
wherein the high melting point solder is disposed only in the first region.

22. The electronic component of claim 21, wherein the first region is adjacent to one end of the capacitor body and a second region is adjacent to a center of the capacitor body.

23. The electronic component of claim 21, wherein the second region contacts a surface of the capacitor body.

24. The electronic component of claim 21, wherein both ends of the high melting point solder directly contact the first and second external electrodes, and
wherein the high melting point solder extends (i) along at least a portion of a surface of the first external electrode, and (ii) toward an end of the capacitor body.

* * * * *